(12) United States Patent
Wu

(10) Patent No.: US 7,005,341 B1
(45) Date of Patent: Feb. 28, 2006

(54) DYNAMIC RANDOM ACCESS MEMORY CELL AND FABRICATING METHOD THEREOF

(75) Inventor: Hsiao-Che Wu, Taoyuan Hsien (TW)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 10/711,574

(22) Filed: Sep. 25, 2004

(30) Foreign Application Priority Data

Aug. 11, 2004 (TW) .............................. 93123996 A

(51) Int. Cl.
 *H01L 21/8234* (2006.01)
 *H01L 21/8244* (2006.01)
(52) U.S. Cl. ...................................... 438/238; 438/381
(58) Field of Classification Search ............... 438/238,
 438/381, 243, 246, 249, 270, 680, 700, 663,
 438/637, 733, 734, 735, 386, 389, 392, 433,
 438/447
See application file for complete search history.

(56) References Cited

U.S. PATENT DOCUMENTS

| | | | | |
|---|---|---|---|---|
| 5,945,707 A | * | 8/1999 | Bronner et al. | 257/330 |
| 6,037,194 A | * | 3/2000 | Bronner et al. | 438/147 |
| 6,426,253 B1 | * | 7/2002 | Tews et al. | 438/243 |

* cited by examiner

Primary Examiner—David Nhu
(74) Attorney, Agent, or Firm—Jiang Chyun IP Office

(57) ABSTRACT

A method of fabricating a dynamic random access memory cell is provided. A substrate having a patterned mask layer thereon and a deep trench therein is provided. The patterned mask layer exposes the deep trench. A deep trench capacitor is formed inside the deep trench. Thereafter, a trench is formed in the substrate on one side of the deep trench capacitor. The trench exposes a portion of the upper electrode of the deep trench capacitor and a portion of the substrate. After that, a semiconductor strip is formed in the trench. A gate dielectric layer is formed over the substrate to cover the exposed semiconductor strip and the substrate. A gate is formed over the gate dielectric layer such that the gate and the semiconductor strip crosses over each other, and the gate-covered portion of the semiconductor strip serves as a channel region.

17 Claims, 7 Drawing Sheets

DYNAMIC RANDOM ACCESS MEMORY CELL AND FABRICATING METHOD THEREOF

CROSS-REFERENCE TO RELATED APPLICATION

This application claims the priority benefit of Taiwan application serial no. 931223996, filed Aug. 11, 2004.

BACKGROUND OF THE INVENTION

1. Field of the Invention

The present invention relates to a memory device and fabricating method thereof. More particularly, the present invention relates to a dynamic random access memory cell and fabricating method thereof.

2. Description of the Related Art

With each new generation of microprocessor functionally more powerful, the type of software programs that can be operated on is getting bigger and bigger. As a result, memory with an ever-increasing storage capacity and a faster access speed is demanded. Due to the increasing importance of memory storage capacity and operation speed, innovative technique for fabricating memory devices is always a major research target in the semiconductor industry.

In general, memory types can be categorized according to the storage state into volatile memory and non-volatile memory. Dynamic random access memory (DRAM) is a type of volatile memory constructed from an array of memory cells. Each memory cell comprises an active device and a capacitor. Furthermore, each memory cell is electrically connected to a word line (WL) and a bit line (BL).

According to the type of capacitor used in each memory cell, dynamic random access memory can be further subdivided into a stack capacitor DRAM and a deep trench capacitor DRAM. Because the deep trench capacitor of a deep trench capacitor DRAM is formed deep within the substrate, planarization is less of a problem compared with a stack capacitor DRAM. Hence, deep trench capacitor DRAM is particularly suitable for fabricating smaller memory devices. However, more and more problems are still encountered in the process of fabricating the deep trench capacitor DRAM as the size of each device is reduced.

FIGS. 1A through 1D are schematic cross-sectional views showing the steps for fabricating a portion of a conventional DRAM with a deep trench capacitor. As shown in FIG. 1A, a substrate 100 is provided, and then a patterned pad layer 102 and a mask layer 104 are sequentially formed over the substrate 100. Thereafter, using the patterned pad layer 102 and the mask layer 104 as an etching mask, a deep trench 106 is formed in the substrate 100. A lower electrode 108 is formed in the substrate 100 at the bottom portion of the deep trench 106. After that, a capacitor dielectric layer 110 and a polysilicon layer 112 are sequentially formed over the bottom portion of the deep trench 106. A collar oxide layer 114 is formed over the mask layer 104 and on the exposed interior surface of the deep trench 106 where does the polysilicon layer 112 not cover.

As shown in FIG. 1B, an anisotropic etching process is carried out to remove the collar oxide layer 114 at the top portion of the mask layer 104 and the polysilicon layer 112. The remaining collar oxide layer forms a collar oxide layer 114a on the sidewall of the deep trench 106. Thereafter, polysilicon is deposited into the deep trench 106 to form a polysilicon layer 116.

As shown in FIG. 1C, a portion of the polysilicon layer 116 outside the deep trench 106 and a portion of the polysilicon layer 116 inside the trench 106 are removed to form a polysilicon layer 116a. Thereafter, the exposed collar oxide layer 114a is removed to form a collar oxide layer 114b. Polysilicon is deposited into the deep trench 106 to form a polysilicon layer 118. The polysilicon layers 112, 116a and 118 are electrically connected together to form the upper electrode of the deep trench capacitor.

As shown in FIG. 1D, a thermal process is carried out to trigger the out-diffusion of dopants inside the polysilicon layer 118 into the substrate 100. Hence, a buried strap (BS) 120 is formed in the substrate 100 around the polysilicon layer 118. The buried strap 120 has a buried strap window 122. Thereafter, a shallow trench isolation (STI) process is carried out to form a STI structure 124 in the substrate 100 adjacent to the polysilicon layer 118 and form a polysilicon layer 118a. The STI structure 124 also defines an active region (not shown). After that, the pad layer 102 and the mask layer 104 are removed. Then, a gate structure 126 is formed on the active region of the substrate 100 and another gate structure 128 is formed on the STI structure 124. A source region 130a and a drain region 130b are formed in the substrate 100 on each side of the gate structure 126. The drain region 130b is electrically connected to the upper electrode of the deep trench capacitor through the buried strap 120.

However, the size of the buried strap window 122 formed by the aforementioned DRAM fabrication process influences the performance of the DRAM device. For example, if the buried strap window is too large, leakage current will be a significant problem for the device. On the other hand, if the buried strap window is too small, the resistance between the buried strap and the upper electrode may be too high leading to a significant drop in the performance of the device. Therefore, the size of the buried strap window has become one of the critical factors affecting the performance of DRAM devices.

SUMMARY OF THE INVENTION

Accordingly, at least one objective of the present invention is to provide a method of fabricating a dynamic random access memory cell capable of resolving the problem resulting from too large or too small a buried strap window.

At least a second objective of the present invention is to provide an alternative method of fabricating a dynamic random access memory cell capable of resolving the problem resulting from too large or too small a buried strap window.

At least a third objective of the present invention is to provide a dynamic random access memory cell capable of resolving the problem resulting from too large or too small a buried strap window.

To achieve these and other advantages and in accordance with the purpose of the invention, as embodied and broadly described herein, the invention provides a method of fabricating a dynamic random access memory (DRAM) cell. First, a substrate having a patterned mask layer thereon and a deep trench therein is provided. The patterned mask layer exposes the deep trench. A lower electrode is formed in the substrate at a bottom portion of the deep trench and a capacitor dielectric layer is formed on the exposed surface of the deep trench. Thereafter, a conductive material is deposited into the bottom portion of the deep trench to form a first conductive layer. The capacitor dielectric layer not covered by the first conductive layer is removed. After that, a collar oxide layer is formed on the sidewall of the deep trench exposed by the first conductive layer. A second conductive material is deposited into the deep trench to form a second conductive layer over the first conductive layer. A trench is formed in the substrate on one side of the second conductive layer. The trench exposes a portion of the substrate and the second conductive layer. Thereafter, a semiconductor strip is formed inside the trench such that the semiconductor strip exposes a portion of the substrate at the bottom portion of the trench. One end of the semiconductor strip is adjacent to the second conductive layer while the other end of the semiconductor strip is adjacent to the substrate. A gate dielectric layer is formed over the substrate to cover the exposed semiconductor strip and the substrate. Then, a gate is formed over the gate dielectric layer such that the gate crosses over the semiconductor strip and the portion of the semiconductor strip underneath the gate serves as a channel region.

The present invention also provides an alternative method of fabricating a dynamic random access memory (DRAM) cell. First, a substrate having a patterned mask layer thereon and a deep trench capacitor therein is provided. The deep trench capacitor comprises a lower electrode, an upper electrode, a capacitor dielectric layer and a collar oxide layer. The patterned mask layer exposes the upper electrode of the deep trench capacitor. Thereafter, a trench is formed in the substrate on one side of the deep trench capacitor. The trench exposes a portion of the substrate and the upper electrode. A semiconductor material is deposited into the trench to form a semiconductor material layer. After that, the semiconductor material layer is patterned to form a semiconductor strip and a pair of openings that expose a portion of the substrate. One end of the semiconductor strip is adjacent to the upper electrode while the other end of the semiconductor strip is adjacent to the substrate. A gate dielectric layer is formed over the substrate to cover the exposed semiconductor strip and substrate. Next, a conductive layer is formed over the gate dielectric layer. The conductive layer crosses over the semiconductor strip and the portion of the semiconductor strip underneath the conductive layer serves as a channel region.

The present invention also provides a dynamic random access memory (DRAM) cell. The DRAM cell comprises a deep trench capacitor and an active device. The deep trench capacitor is disposed inside the deep trench in the substrate. The deep trench capacitor comprises a lower electrode, an upper electrode, a capacitor dielectric layer and a collar oxide layer. The lower electrode is disposed in the substrate at the bottom portion of the deep trench. The upper electrode is disposed in the deep trench. The capacitor dielectric layer is disposed between the bottom surface of the deep trench and the upper electrode. The collar oxide layer is disposed on the sidewall of the deep trench not covered by the capacitor dielectric layer, and is between the upper electrode and the substrate. The active device is disposed in a trench in the substrate adjacent to the deep trench capacitor. Furthermore, the active device comprises a semiconductor strip, a gate dielectric layer, a gate and a doped region. The semiconductor strip is disposed in the trench and exposes a portion of the substrate at the bottom portion of the trench. One end of the semiconductor strip is adjacent to the substrate while the other end of the semiconductor strip is adjacent to the upper electrode. In addition, the gate dielectric layer is disposed on the surface of the semiconductor strip. The gate is disposed on the gate dielectric layer. The gate crosses over the semiconductor strip, and the gate-covered portion of the semiconductor strip serves as a channel region. The doped region is disposed in a portion of the semiconductor strip adjacent to the substrate and the adjacent substrate thereof.

In the present invention, the portion of the semiconductor strip covered by the gate of an active device serves as a channel region. Furthermore, the semiconductor strip is adjacent to the conductive layer (or the top portion of the upper electrode) of the deep trench capacitor. Hence, there is no need to form a buried strap for electrically connecting with the active device. Therefore, the present invention is capable of resolving the problem resulting from too large or too small a buried strap window.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
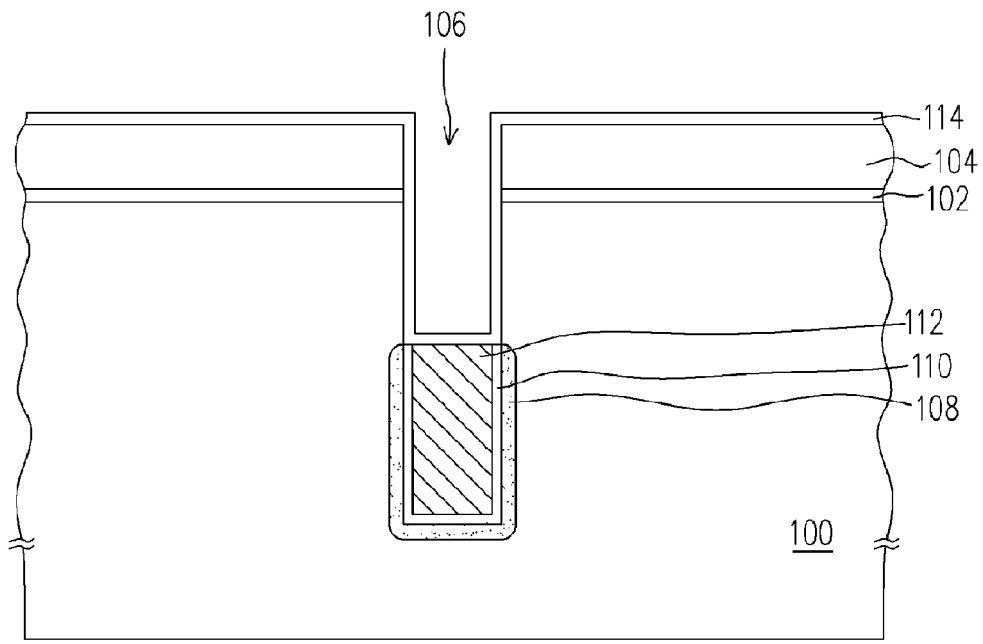
FIGS. 1A through 1D are schematic cross-sectional views showing the steps for fabricating a portion of a conventional DRAM with a deep trench capacitor.
Figure 1B:
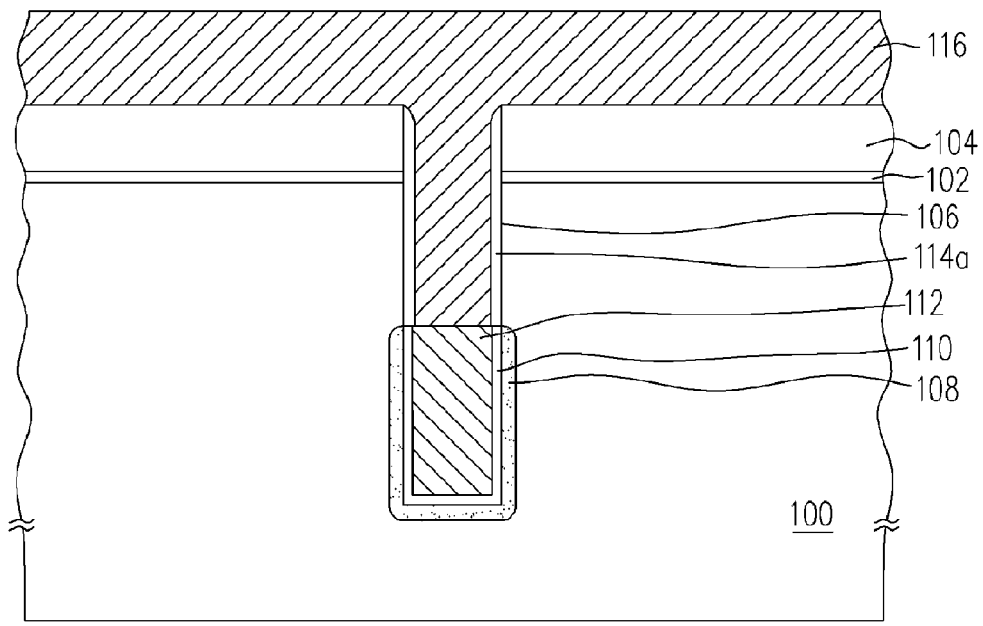
Figure 1C:
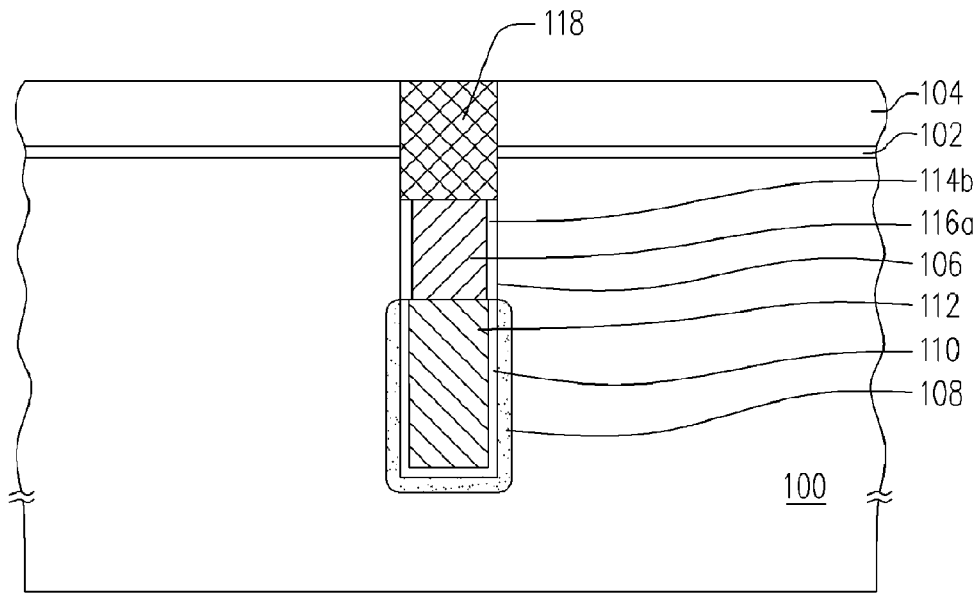
Figure 1D:
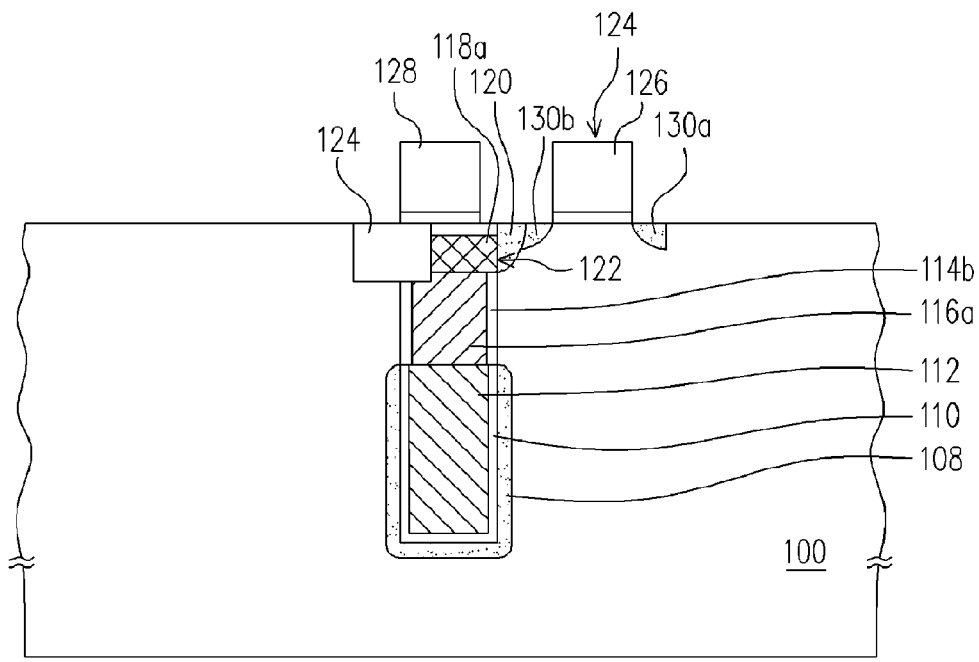

Reference will now be made in detail to the present preferred embodiments of the invention, examples of which are illustrated in the accompanying drawings. Wherever possible, the same reference numbers are used in the drawings and the description to refer to the same or like parts.

Figure 2:
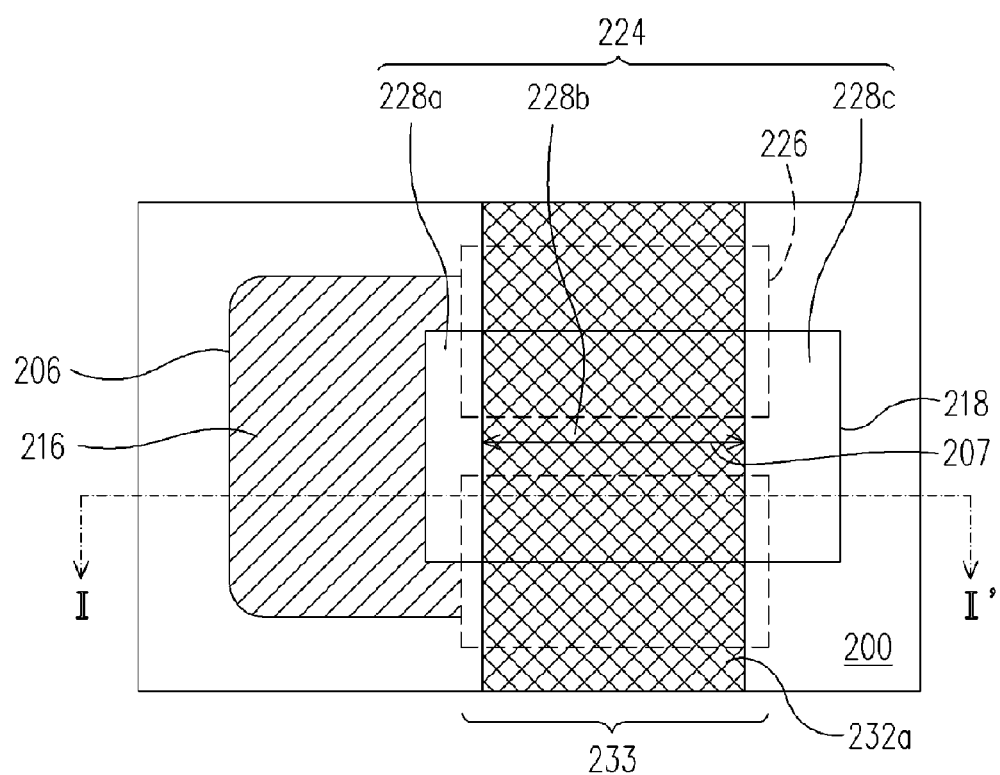
FIG. 2 is a top view of a dynamic random access memory cell according to one preferred embodiment of the present invention.
Figure 3:
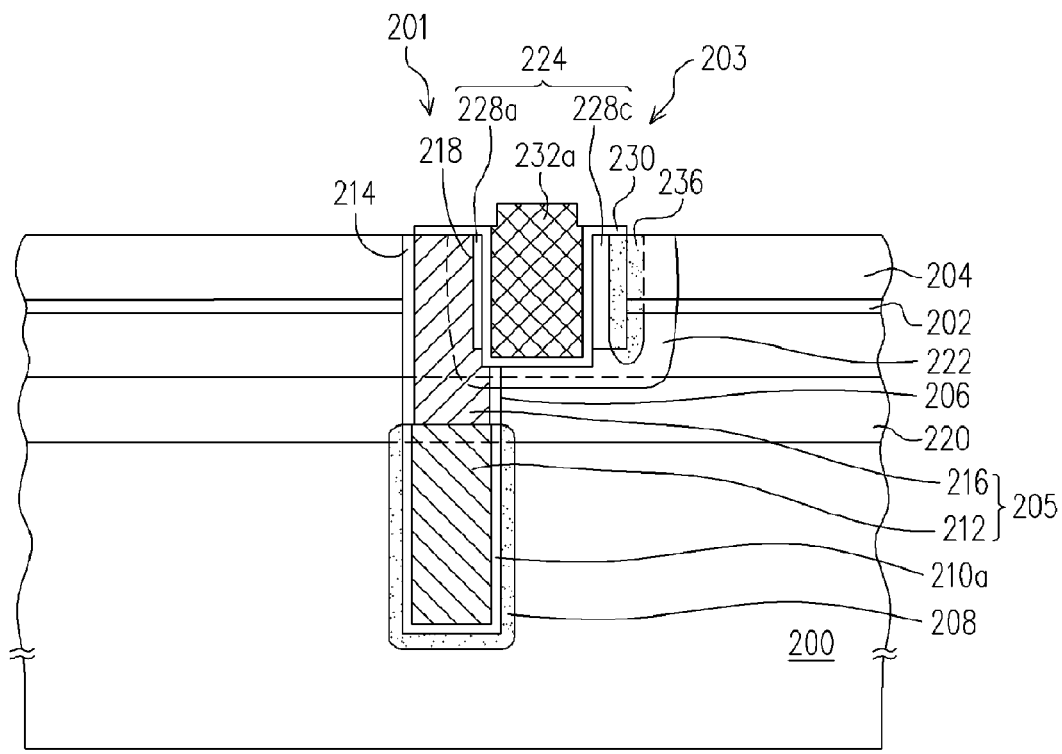
FIG. 3 is a schematic cross-sectional view along line I—I' of the dynamic random access memory cell shown in FIG. 2.

FIG. 2 is a top view of a dynamic random access memory cell according to one preferred embodiment of the present invention. FIG. 3 is a schematic cross-sectional view along line I—I' of the dynamic random access memory cell shown in FIG. 2. As shown in FIGS. 2 and 3, the dynamic random access memory cell of the present invention comprises a deep trench capacitor 201 and an active device 203. The deep trench capacitor 201 is disposed inside a deep trench 206 within a substrate 200. The deep trench capacitor 201 comprises a lower electrode 208, an upper electrode 205, a capacitor dielectric layer 210a and a collar oxide layer 214. In one preferred embodiment, the upper electrode 205 comprises conductive layers 212 and 216. The active device 203 is disposed in another trench 218 in the substrate 200 adjacent to the deep trench capacitor 201. The active device 203 comprises a semiconductor strip 228b, a gate dielectric layer 230, a conductive layer 232a and a doped region 236. In one preferred embodiment, extension portions 228a and 228c are attached to each end of the semiconductor strip 228b to form an H-shaped semiconductor layer 224.

The lower electrode 208 of the deep trench capacitor 201 is disposed in the substrate 200 at the bottom portion of the deep trench 206. The conductive layer 212 is disposed at the bottom portion of the deep trench 206. Furthermore, the capacitor dielectric layer 210a is disposed between the surface of the bottom portion of the deep trench 206 and the conductive layer 212. The conductive layer 216 is disposed over the conductive layer 212 and completely fills the deep trench 206. The collar oxide layer 214 is disposed between the conductive layer 216 and the substrate 200.

The semiconductor strip 228b of the active device 203 is disposed inside the trench 218. The semiconductor strip 228b exposes a portion of the substrate 200 at the bottom portion of the trench 218. The extension portion 228a is positioned next to the conductive layer 216 while the extension portion 228c is positioned next to the substrate 200. Obviously, the semiconductor strip 228b can be only disposed inside the trench 218 in another embodiment so that the ends of the semiconductor strip 228b are positioned next to the conductive layer 216 and the substrate 200, respectively. The semiconductor strip 228b and the extension portions 228a and 228c are fabricated from, for example, epitaxial silicon or other suitable semiconductor material for forming a channel. In one preferred embodiment, a portion of the substrate 200 outside the trench 218 may also be exposed (e.g. an enclosed area 226 by dash line in FIG. 2) aside from that portion of the substrate at the bottom of the trench 218.

The gate dielectric layer 230 is disposed on the semiconductor strip 228b and the extension portions 228a and 228c. In one preferred embodiment, the gate dielectric layer 230 may also be disposed on the top surface of the conductive layer 216.

Figure 4:
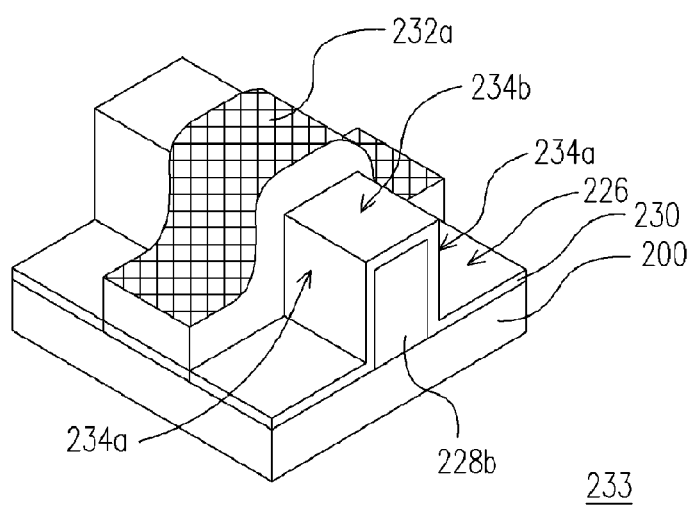
FIG. 4 is a perspective view of a portion of the dynamic random access memory cell shown in FIG. 2.

The conductive layer 232a is disposed on a portion of the gate dielectric layer 230. The conductive layer 232a crosses over the semiconductor strip 228b, and the portion of the semiconductor strip 228b covered by the conductive layer 232a serves as a channel region 207. FIG. 4 is a perspective view showing the conductive layer 232a crossing over the semiconductor strip 228b (the labeled area 233 in FIG. 2). Since the conductive layer 232a covers the two sidewalls 234a and the top portion 234b of the semiconductor strip 228b, the active device 203 is able to avoid some problems resulting from short channel effect. In addition, the conductive layer 232a may serve as a gate of a single memory cell or a word line for serially connecting an array of memory cells.

The doped region 236, which serves as a source region, is disposed in a portion of the extension portion 228c of the semiconductor strip 228b and in a portion of the substrate 200 adjacent to the extension portion 228c of the semiconductor strip 228b.

In another embodiment, the dynamic random access memory cell further comprises a doped stripe 220 disposed in the substrate 200 adjacent to the lower electrode 208.

In yet another embodiment, the dynamic random access memory cell further comprises a doped well 222 disposed within a portion of the conductive layer 216 and its adjacent substrate 200. Additionally, the trench 218 is disposed in the doped well 222.

Furthermore, in yet another embodiment, the dynamic random access memory cell further comprises a doped stripe 220 disposed in the substrate 200 and a doped well 222 disposed in a portion of the conductive layer 216 and its adjacent substrate 200. The doped stripe 220 is adjacent to the lower electrode 208 and the doped well 222. In addition, the doped well 222 and the doped stripe 220 are doped with opposite type of dopants.

In the present invention, the portion of the semiconductor strip covered by the conductive layer (the gate) serves as a channel region. Furthermore, the semiconductor strip or its extension portion is adjacent to the conductive layer (or the top portion of the upper electrode) of the deep trench capacitor. Hence, there is no need to form a buried strap for electrically connecting the deep trench capacitor with the active device. Therefore, the present invention is capable of resolving the problem resulting from too large or too small a buried strap window.

Figure 5A:
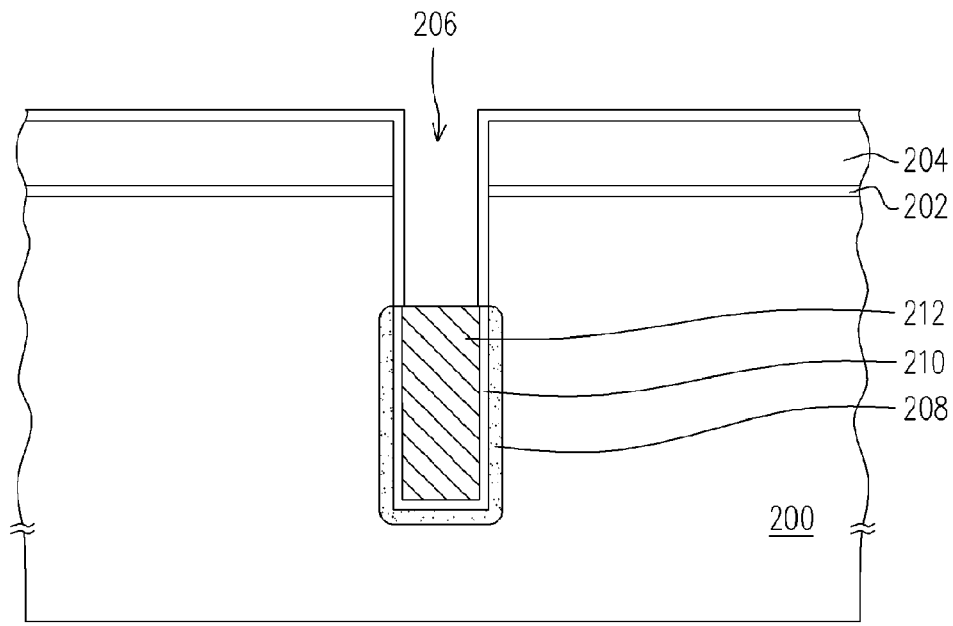
FIGS. 5A through 5E are schematic cross-sectional views along line I—I' in FIG. 2 for showing the steps of fabricating a dynamic random access memory cell.

FIGS. 5A through 5E are schematic cross-sectional views showing the steps of fabricating a dynamic random access memory cell. As shown in FIG. 5A, a substrate 200 is provided. After forming a pad layer 202 over the substrate 200 blankly, a mask layer 204 is formed over the pad layer 202. The pad layer 202 is a silicon oxide layer formed by, for example, performing a thermal oxidation process. The mask layer 204 is a silicon nitride layer formed by, for example, performing a chemical vapor deposition (CVD) process. Thereafter, photolithographic and etching processes are carried out to pattern the mask layer 204 and the pad layer 202. Using the patterned mask layer 204 and the pad layer 202 as a mask, an etching process is carried out to form a deep trench 206 in the substrate 200. The substrate 200 is etched in a dry etching process, for example.

After that, a lower electrode 208 is formed in the substrate 200 at the bottom portion of the deep trench 206. The lower electrode 208 is a doped region, for example. The lower electrode 208 is formed, for example, by depositing a doped insulating material on the sidewalls of the bottom portion of the deep trench 206 to form a doped insulation layer, and then filling the deep trench 208 with a photoresist material. Thereafter, the doped insulation layer uncovered by the photoresist layer is removed. After removing the photoresist layer, a conformal insulating layer is formed. A thermal process is carried out to trigger dopants of the doped insulation layer diffusing into the substrate 200. Finally, the insulation layer and the doped insulation layer are removed. In one preferred embodiment, the lower electrode 208 is doped with n-type material. Since the fabrication of the lower electrode 208 is a known art, detailed description is omitted herein.

A conformal capacitor dielectric layer 210 is formed over the mask layer 204 and the interior surface of the deep trench 206. The capacitor dielectric layer 210 is, for example, a silicon oxide layer, a silicon nitride layer, a silicon oxynitride layer or other suitable dielectric material layer. The capacitor dielectric layer 210 is formed, for example, by performing thermal oxidation, chemical vapor deposition or some other suitable processes.

Conductive material is deposited into the bottom portion of the deep trench 206 to form a conductive layer 212 covering a portion of the capacitor dielectric layer 210. The conductive layer 212 is fabricated, for example, using polysilicon, doped polysilicon or other suitable conductive material. The conductive layer 212 is formed, for example, by performing a chemical vapor deposition process with in-situ ion implement to form a doped polysilicon layer over the substrate 200, and then removing the doped polysilicon layer outside the deep trench 206 and a portion of the doped polysilicon layer at the top portion of the deep trench 206. The method of removing a portion of the doped polysilicon includes, for example, a dry etching process or a wet etching process. Aside from the in-situ ion implement for forming the doped polysilicon layer, it is possible to form the doped polysilicon layer by introducing a dopant-containing reactive gas into the reaction chamber during the chemical vapor deposition.

Figure 5B:
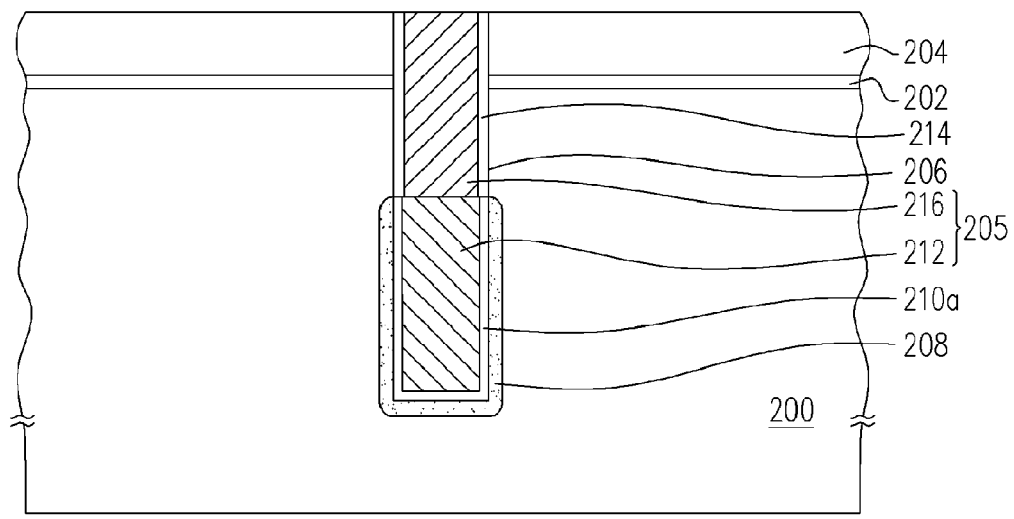

As shown in FIG. 5B, the capacitor dielectric layer 210 not covered by the conductive layer 212 is removed to form a capacitor dielectric layer 210a. The method of removing a portion of the capacitor dielectric layer 210 includes performing a dry etching or a wet etching process, for example.

A collar oxide layer 214 is formed on the sidewall of the deep trench 206 exposed by the conductive layer 212. The collar oxide layer 214 is a silicon oxide layer formed by, for example, performing a chemical vapor deposition process to produce a conformal collar oxide material layer over the substrate 200. Thereafter, the collar oxide material layer outside the deep trench 206 and the collar oxide material layer above the conductive layer 212 inside the deep trench 206 are removed. The method of removing a portion of the collar oxide material layer includes, for example, performing an anisotropic etching process.

Thereafter, conductive material is deposited into the deep trench 206 to form a conductive layer 216 and covers the conductive layer 212. The conductive layer 216 is electrically connected to the conductive layer 212. The conductive layers 216 and 212 form the upper electrode 205 of the deep trench capacitor. Since the conductive 216 is fabricated using a material and a process similar to the conductive layer 212, detailed description is omitted.

Figure 5C:
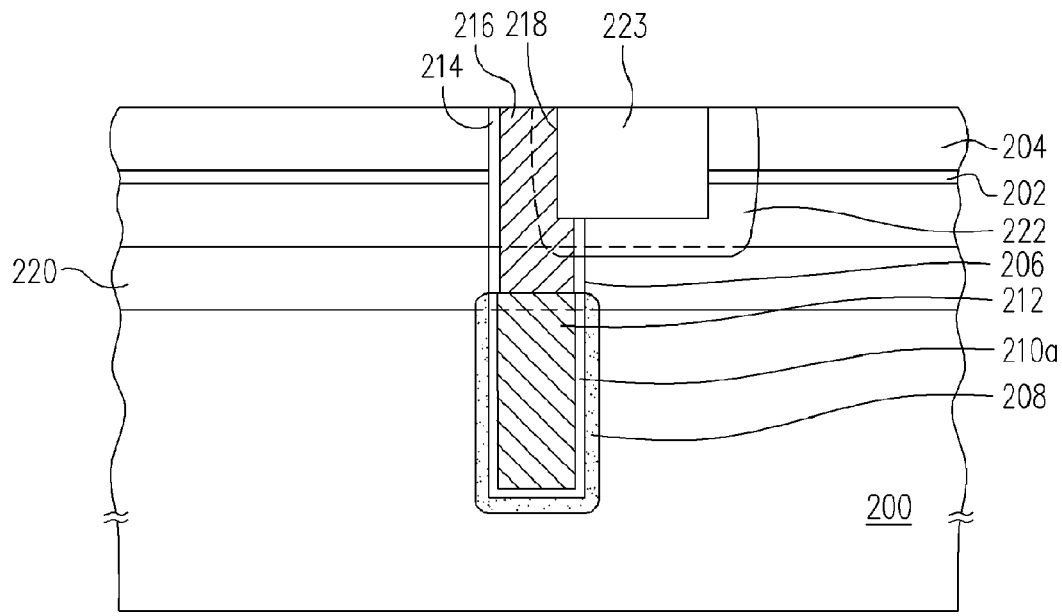

The processes for fabricating the active device are carried out next. As shown in FIG. 5C, another trench 218 is formed in the substrate 200 on one side of the conductive layer 216. The trench 218 exposes a portion of the substrate 200 and the conductive layer 216. The trench 218 is formed by an etching process, for example. In one preferred embodiment, a doped stripe 220 is formed in the substrate 200 adjacent to the lower electrode 208 before forming the trench 218. The doped stripe 220 is a region of n-doped material, for example. In another preferred embodiment, before forming the trench 218, a doped well 222 is formed in a portion of the conductive layer 216 and its adjacent substrate 200 where is designated for forming the trench 218 so that the trench 218 is formed within the doped well 222. The doped well 222 is a region of p-doped material, for example. In yet another preferred embodiment, before forming the trench 218, a doped stripe 220 is formed in the substrate 200 and a doped well 222 is formed in a portion of the conductive layer 216 and its adjacent substrate 200 where is designated for forming the trench 218. The doped stripe 220 is adjacent to the lower electrode 208 and the doped well 222. Furthermore, the doped stripe 220 and the doped well 222 are doped using opposite type of dopants.

Semiconductor material is deposited into the trench 218 to form a semiconductor material layer 223. The semiconductor material layer 223 is fabricated using epitaxial silicon or other suitable channel material, and the semiconductor material is deposited by a chemical deposition process, for example.

Figure 5D:
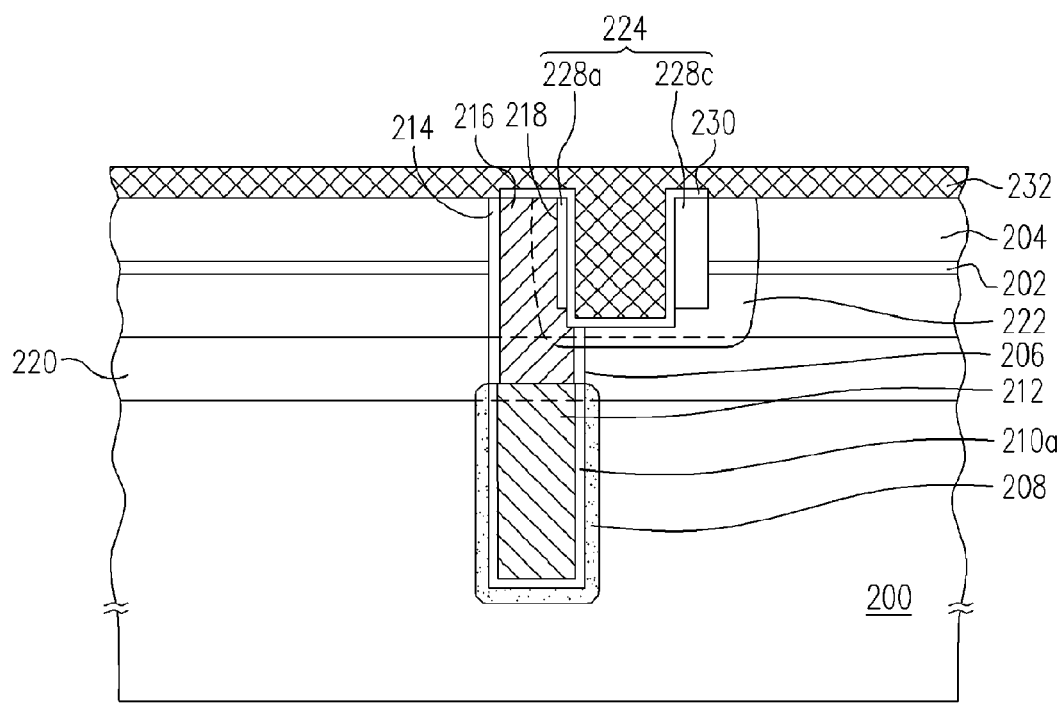

Referring to FIG. 5D and FIG. 2, the semiconductor material layer 223 (as shown in FIG. 5C) is patterned to form a semiconductor strip 228b in the trench 218. The semiconductor strip 228b is shown in FIG. 2. In one preferred embodiment, a portion of the mask layer 204, the pad layer 202 and the substrate 200 are removed to form two openings (enclosed area 226 by dash line in FIG. 2) that expose the substrate 200. In another preferred embodiment, the process of forming the semiconductor strip 228b in the trench 218 further includes forming extension portions 228a and 228c on each end of the semiconductor strip 228b to form an H-shaped semiconductor layer 224. The extension portion 228a is adjacent to the conductive layer 216 while the other extension portion 228c is adjacent to the substrate 200. The semiconductor strip 228b and its extension portions 228a and 228c are fabricated using, for example, epitaxial silicon or other semiconductor material suitable for forming a channel.

A gate dielectric layer 230 is formed over the substrate 200 to cover the exposed semiconductor strip 228b, the extension portions 228a and 228c and the substrate 200. The gate dielectric layer 230 is a silicon oxide layer formed by, for example, performing a thermal oxidation process. In one preferred embodiment, the gate dielectric layer 230 is formed on the top surface of the conductive layer 216. Thereafter, a conductive layer 232 is formed over the substrate 200 to cover the gate dielectric layer 230.

Figure 5E:
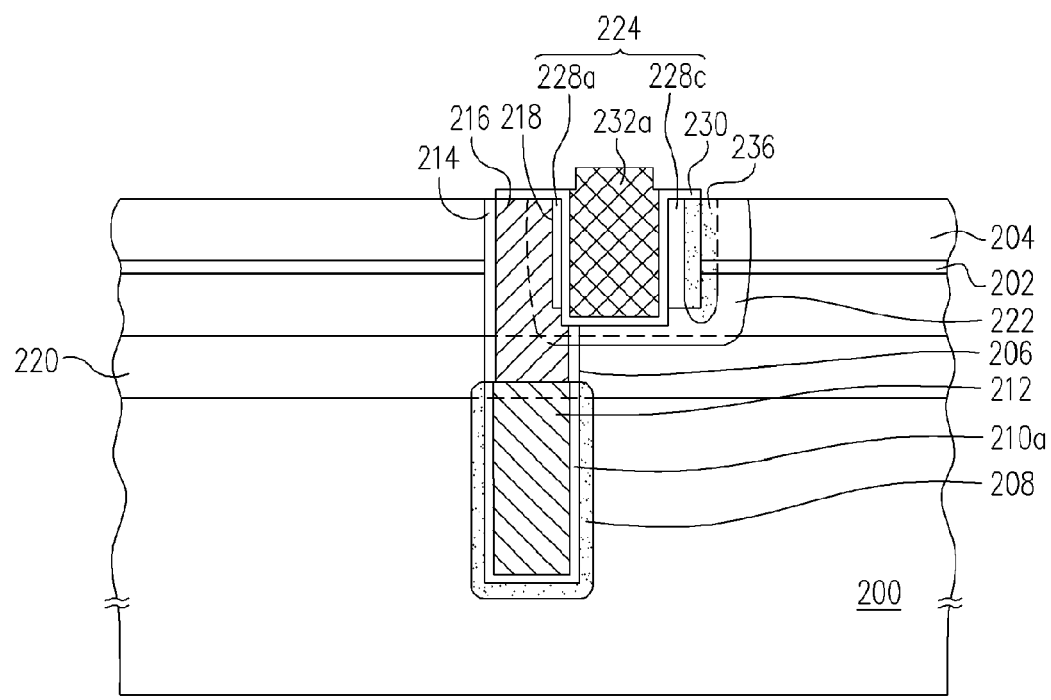

As shown in FIG. 5E, a portion of the conductive layer 232 is removed to form a conductive layer 232a over a portion of the gate dielectric layer 230. The conductive layer 232a crosses over the semiconductor strip 228b, and the portion of the semiconductor strip 228b covered by the conductive layer 232a serves as a channel region 207 (as shown in FIG. 2). FIG. 4 is a perspective view showing the conductive layer 232a crossing over the semiconductor strip 228b (the labeled area 233 in FIG. 2). It should be noted that the conductive layer 232a covers the two sidewalls 234a and the top portion 234b of the semiconductor strip 228b that is used as a channel region. Hence, the active device 203 is able to avoid some problems induced by short channel effect. In addition, the conductive layer 232a may serve as a gate of a single memory cell or a word line for serially connecting an array of memory cells.

In one preferred embodiment, a doped region 236 serving as a source region is formed in a portion of the extension portion 228c of the semiconductor strip 228b and the substrate 200 adjacent to the extension portion 228c.

In addition, an interconnect process for electrically connecting the doped region 236 and the conductive layer 232a with an external circuit through a contact is performed after forming the doped region 236.

In the present invention, the portion of the semiconductor strip covered by the conductive layer (the gate) of the active device serves as a channel region. Furthermore, the semiconductor strip is adjacent to the conductive layer (or the top portion of the upper electrode) of the deep trench capacitor. Hence, there is no need to form a buried strap for electrically connecting the deep trench capacitor with the active device. Therefore, the present invention is capable of resolving the problem resulting from too large or too small a buried strap window.

The aforementioned steps for fabricating the deep trench capacitor serve to illustrate the spirit of the present invention only and hence should by no means limit the scope of the present invention. In other words, other process of fabricating the deep trench capacitor may be carried out first, and then using the steps shown in FIGS. 5C through 5E to form the active device. In this way, the problem due to having too large or too small a buried stripe window is similarly resolved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a dynamic random access memory cell, comprising the steps of:
   providing a substrate having a patterned mask layer thereon and a deep trench therein, wherein the patterned mask layer exposes the deep trench, and the substrate has a lower electrode formed at a bottom portion of the deep trench, wherein an interior surface of the deep trench has a capacitor dielectric layer thereon;
   filling with a first conductive layer at the bottom portion of the deep trench;
   removing the capacitor dielectric layer uncovered by the first conductive layer;
   forming a collar oxide layer on a sidewall of the deep trench uncovered by the first conductive layer;
   filling with a second conductive layer over the first conductive layer in the deep trench;
   forming a trench in the substrate on one side of the second conductive layer, wherein the trench exposes a portion of the substrate and the second conductive layer;
   forming a semiconductor strip in the trench to expose a portion of the substrate at the bottom portion of the trench, wherein one end of the semiconductor strip is positioned next to the second conductive layer while the other end of the semiconductor strip is positioned next to the substrate;
   forming a gate dielectric layer over the substrate to cover an exposed semiconductor strip and the substrate; and
   forming a gate over the gate dielectric layer, wherein the gate crosses over the semiconductor strip, and the gate-covered portion of the semiconductor strip serves as a channel region.

2. The method according to claim 1, wherein the semiconductor strip comprises epitaxial silicon.

3. The method according to claim 1, wherein the step of forming the semiconductor strip comprises:
   depositing a semiconductor material layer into the trench; and
   patterning the semiconductor material layer.

4. The method according to claim 3, wherein the step of patterning the semiconductor material layer further comprises removing a portion of the patterned mask layer and the substrate.

5. The method according to claim 1, wherein the step of forming the semiconductor strip in the trench further comprises forming a first extension portion and a second extension portion on each end of the semiconductor strip so that an H-shaped semiconductor layer is formed.

6. The method according to claim 1, further comprising forming a doped region in a portion of the semiconductor strip adjacent to the substrate and in the substrate adjacent to the semiconductor strip after forming the gate.

7. The method according to claim 1, wherein the step of forming the collar oxide layer comprises:
   forming a collar oxide material layer on the sidewall of the deep trench, the top of the first conductive layer and the substrate; and
   removing the collar oxide material layer on the top of the first conductive layer and the substrate.

8. The method according to claim 1, further comprising forming a doped stripe in the substrate adjacent to the lower electrode before forming the trench in the substrate on one side of the second conductive layer.

9. The method according to claim 1, further comprising forming a doped well in a portion of the second conductive layer and the substrate before forming the trench in the substrate on one side of the second conductive layer, so that the trench is formed within the doped well.

10. A method of fabricating a dynamic random access memory cell, comprising the steps of:
    providing a substrate having a patterned mask layer thereon and a deep trench capacitor therein, wherein the deep trench capacitor comprises a lower electrode, an upper electrode, a capacitor dielectric layer and a collar oxide layer, and the patterned mask layer exposes the upper electrode;
    forming a trench in the substrate on one side of the deep trench capacitor, wherein the trench exposes a portion of the substrate and the upper electrode;
    depositing a semiconductor material layer into the trench;
    patterning the semiconductor material layer to form a semiconductor strip and two openings exposing the substrate, wherein one end of the semiconductor strip is positioned next to the upper electrode while the other end of the semiconductor strip is positioned next to the substrate;
    forming a gate dielectric layer over the substrate to cover an exposed semiconductor strip and the substrate; and
    forming a conductive layer over the gate dielectric layer, wherein the conductive layer crosses over the semiconductor strip, and the semiconductor strip covered by the conductive layer serves as a channel region.

11. The method according to claim 10, wherein the semiconductor strip comprises epitaxial silicon.

12. The method according to claim 10, wherein the step of forming the semiconductor strip in the trench further comprises forming a first extension portion and a second extension portion on each end of the semiconductor strip so that an H-shaped semiconductor layer is formed.

13. The method according to claim 10, further comprising forming a doped region in a portion of the semiconductor strip adjacent to the substrate and in the substrate adjacent to the semiconductor strip after forming the conductive layer.

14. The method according to claim 10, wherein the step of patterning the semiconductor material layer further comprises removing a portion of the patterned mask layer and the substrate.

15. The method according to claim 10, wherein the upper electrode comprises a first conductive layer and a second conductive layer, mid the semiconductor strip is positioned next to the second conductive layer.

16. The method according to claim 15, further comprising forming a doped well in a portion of the second conductive layer and the substrate before forming the trench in the substrate on one side of the deep trench capacitor, so that the trench is formed within the doped well.

17. The method according to claim 10, further comprising forming a doped stripe in the substrate adjacent to the lower electrode before forming the trench in the substrate on one side of the deep trench capacitor.

* * * * *